Jan. 4, 1966 R. R. DIMMICK 3,227,963

DIGITAL FREQUENCY SYNTHESIZER HAVING A PLURALITY OF CASCADED PHASE-LOCKED DIGIT SELECTOR STAGES

Filed March 19, 1962 3 Sheets-Sheet 1

INVENTOR.
RALPH R. DIMMICK
BY
Louis J. Knobbe
ATTORNEY

Jan. 4, 1966 R. R. DIMMICK 3,227,963

DIGITAL FREQUENCY SYNTHESIZER HAVING A PLURALITY OF CASCADED PHASE-LOCKED DIGIT SELECTOR STAGES

Filed March 19, 1962 3 Sheets-Sheet 2

INVENTOR.
RALPH R. DIMMICK

BY Louis J. Knobbe

ATTORNEY

Jan. 4, 1966 R. R. DIMMICK 3,227,963

DIGITAL FREQUENCY SYNTHESIZER HAVING A PLURALITY OF CASCADED PHASE-LOCKED DIGIT SELECTOR STAGES

Filed March 19, 1962 3 Sheets-Sheet 3

INVENTOR.
RALPH R. DIMMICK
BY
Louis J. Knobbe
ATTORNEY

United States Patent Office 3,227,963

Patented Jan. 4, 1966

3,227,963

DIGITAL FREQUENCY SYNTHESIZER HAVING A PLURALITY OF CASCADED PHASE-LOCKED DIGIT SELECTOR STAGES

Ralph R. Dimmick, Kensington, Calif., assignor to Beckman Instruments, Inc., a corporation of California Filed Mar. 19, 1962, Ser. No. 180,782

10 Claims. (Cl. 331—2)

The present invention relates generally to frequency synthesizers and, more particularly, to frequency synthesizers capable of generating a large number of precise frequency signals determined by positioning control means to the desired frequency output.

An object of the present invention is to provide an improved frequency synthesizer capable of generating a plurality of precise frequency output signals having a control means for each significant figure of the desired frequency output.

Another object of the present invention is to provide a frequency synthesizer having a plurality of means for selecting the respective significant figures of the output frequency which are substantially independent of each other thereby allowing a substantially unlimited number of significant figures to be selected.

Other and further objects, features and advantages of the invention will become apparent as the description proceeds.

Briefly, in accordance with a preferred form of the present invention, the present invention includes a plurality of digit selector stages, one for each significant figure of the output frequency generated. Each digit selector stage includes a phase-locked feedback loop for controlling a voltage controlled frequency oscillator. Each unit accepts the output of the oscillator included in the digit selector stage corresponding to the next lower significant digit and locks its voltage controlled oscillator with this information plus information received from a reference frequency source.

A major advantage of a frequency synthesizer constructed in this manner is that there are no multiplied spurious effects. Thus, if a spurious modulation is picked up in one of the digit selector stages, it will show up, if at all, in the final output in an order corresponding to the digit unit in which it originated.

Also disclosed hereinafter is a frequency synthesizer having an improved means for phase-locking each of the digit selector units thereby eliminating or substantially reducing the amount of adjustment required by the operator.

A more thorough understanding of the invention may be obtained by a study of the following detailed description taken in connection with the accompanying drawings in which.

Figure 1:
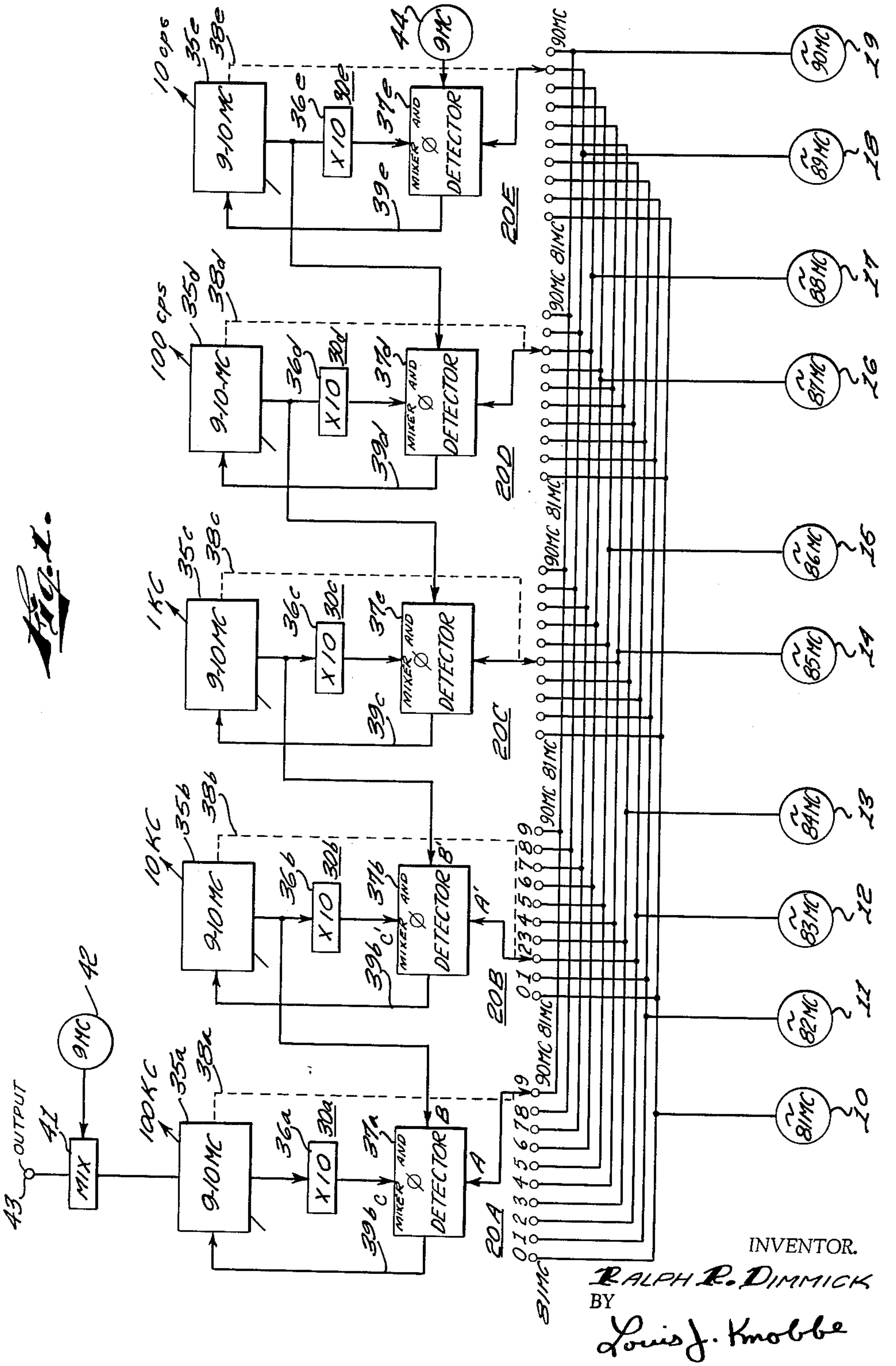
FIG. 1 is a block diagram of a simplified embodiment of the invention.

Referring now to FIG. 1 there is shown a digitally controlled frequency synthesizer comprising ten different reference frequency sources 10, 11, 12, 13, 14, 15, 16, 17, 18 and 19 generating outputs from 81 megacycles to 90 megacycles in respective steps of 1 megacycle. As will be described below, the particular frequency range of these reference frequency sources determines the upper frequency generated by the synthesizer. Accordingly, lower or higher reference frequency sources may be utilized with the result that a lower or higher maximum frequency output will be provided, the particular frequency shown being given by way of specific example. Thus, the frequency synthesizer shown in FIG. 1 is capable of generating digitally controlled frequencies in the range of 10 c.p.s. to 999,990 c.p.s. under the control of five decade knobs or, as many control knobs as there are significant digits in the desired output frequency. As will be obvious from the following description, this frequency range is completely arbitrary and may be increased or decreased according to the components utilized.

Each of the reference sources 10 through 19 is connected to respective contacts of five identical multi-contact switches **20*a*, 20*b*, 20*c*, 20*d* and 20*e*. Each of these multi-contact switches is provided with a movable contact so that any one of the ten reference frequencies may be selected thereby. Each multi-contact switch is associated with a respective digit selector stage 30*a*, 30*b*, 30*c*, 30*d* and 30*e* of the frequency synthesizer. Each of these stages in combination with a respective multi-contact switch controls one significant figure in the final output frequency. Thus, for reasons specified in detail below, digit selector stage 30*a* controls the most significant digit, stage 30*b* the next most significant digit, stage 30*c* the third most significant digit, etc. By way of example, if an output frequency of 924,680 c.p.s. is desired, the first stage 30*a* sets the digit "9," the second stage 30*b* sets the digit "2," the third stage 30*c* sets the digit "4," the fourth stage 30*d* sets the digit "6," and the fifth stage 30*e*** sets the digit "8."

Each of the digit selector stages comprises a phase-locked oscillator. Thus, stage **30*a* includes a local voltage controlled oscillator 35*a*, a frequency multiplier 36*a* which multiplies by a factor of 10, a phase detector 37*a* and the multi-contact switch 20*a*. Each of the local oscillators 35*a*, 35*b* . . . 35*e* provides a plurality of stepped frequency outputs in one-tenth megacycle steps from 9 to 9.9 megacycles, i.e., 9.0 megacycles, 9.1 megacycles, 9.2 megacycles, 9.3 megacycles, etc., when no voltage is supplied to the oscillator from the phase detector via conductor 39. As shown, the local oscillator and multi-contact switch of each phase-locked oscillator stage are mechanically coupled by respective links 38*a*, 38*b*, 38*c*, 38*d* and 38*e*. Thus, the local oscillator 35 of a particular stage generates 9.0 megacycles concurrently with the connection of the 81 megacycle reference frequency source 10 to the phase detector thereof. In like manner, the local oscillator generates 9.1 megacycles concurrently with the connection of the 82 megacycle reference frequency source 11 to the phase detector and 9.9 megacycles concurrently with the connection of the 90 megacycle reference frequency source 19 to the phase detector. The output of the local oscillator in each of the digit selector stages is connected to the input of the frequency multiplier which multiplies the input frequency by a factor of 10. The output of the frequency multiplier 36 in each stage is therefore a plurality of stepped frequency signals in 1 megacycle steps from 90 to 99 megacycles depending upon the stepped frequency output selected therein (assuming no voltage output from the phase detector). These signals are connected to an input of the phase detector. In addition, the movable contact of the multi-contact switch 20** and the output of the local oscillator of the succeeding digit selector stage are connected as inputs to the phase detector. The output of the phase detector is connected in a feedback loop to the input of the local oscillator and provides a control voltage for controlling the frequency output of this oscillator.

The output of the local oscillator of the first stage **38*a* is connected to an input of a mixer circuit 41. Also connected as an input to the mixer 41 is a fixed 9 megacycle frequency source 42. The difference output of mixer 41** is connected to output terminal 43 as the output of the frequency synthesizer.

The operation of the frequency synthesizer shown in FIG. 1 is as follows: The phase detector in each of the digit selector stages provides an output signal for controlling the voltage controlled oscillator such that the sum of the frequencies from the reference frequency source and the succeeding stage of the voltage oscillator source equals the frequency supplied by the frequency multiplier or $$A+B=C \quad (1)$$

wherein A is the frequency supplied by the multi-contact switch from a reference frequency source, B is the frequency supplied by the local oscillator of the succeeding digit selector stage, and C is the signal frequency supplied by the local oscillator-frequency multiplier combination. For the condition shown in FIG. 1, with no control voltage output from the phase detector, the reference frequency A is 90 megacycles, and the local oscillator-frequency multiplier frequency C is 99 megacycles. Thus, for Equation 1 to be satisfied, the frequency B supplied by the local oscillator **35*b* of the succeeding stage 38*b* must equal 9 megacycles. The output of the frequency synthesizer at output terminal 43** is then 9.9—9 megacycles or 900,000 c.p.s.

Assume, however, that the frequency B supplied by the succeeding local oscillator stage **35*b* is not 9.000 megacycles but is instead 9.2 megacycles. A voltage is then generated by the phase detector 37*a* because of the unbalance of Equation 1 which causes the local oscillator 35*a* to change in frequency to balance this equation thereby locking the local oscillator 35*a*. For the assumed output of oscillator 35*b*, the signal C must change to 99.2 megacycles. The output of this synthesizer at output terminal 43 is then 920,000 c.p.s. It may be noted that the first or most significant digit "9" of the output has been determined by the setting of the first stage 38*a* whereas the second most significant digit "2" has been determined by the setting of the second stage 38*b***.

The second digit selector stage **30*b* including local oscillator 35*b*, frequency multiplier 36*b*, phase detector 37*b*, and multi-contact switch 20*b* functions in an identical manner with the first stage 30*a*, the phase detector and feedback path forcing the local oscillator-frequency multiplier combination to equal the sum of the reference frequency supplied by the multi-contact switch 20*b* and the frequency of the local oscillator 35*c* of the succeeding adjacent digit selector stage 30*c*. With no control voltage output from the phase detector 37*b* and the multi-contact switch connected as shown to the 83 megacycle reference, the frequency supplied by the succeeding stage local oscillator 35*c*** is determined by Equation 1 wherein A′ equals 83 megacycles and C′ equals 92 megacycles. B′ must then equal 9.000 megacycles.

Assume, however, that frequency B′ supplied by the succeeding adjacent local oscillator stage **35*c* is not 9.000 megacycles but is instead some other value such as 9.400 megacycles. An output feedback control voltage is then supplied by phase detector 37*b* which forces the local oscillator 35*b* to generate a frequency of 9.24 megacycles. In turn, this frequency is supplied to the first digit selector stage 38*a* as frequency B which forces the voltage output of phase detector 37*a* to change so as to force the local oscillator 35*a* of the first stage to generate an output of 9.924 megacycles. The synthesizer output frequency is then 924,000 c.p.s., the most significant digit "9" being determined by the first stage 38*a*, the second most significant digit "2" being determined by the second stage 38*b* and the third most significant digit "4" being determined by the third stage 38*c*. In like manner, the fourth and fifth digits of the output frequency may be selected by setting the fourth and fifth stages 38*d* and 38*e***, these stages being identical in structure to the first, second and third stages.

The input of the phase detector **37*e* of the final digit selector stage 30*e* is shown as a fixed 9 megacycle oscillator 44. This frequency combines with the reference frequency supplied by multi-contact switch 20*e* and the output of the local oscillator 35*e* and frequency multiplier 36*e* to provide "0" digits beyond the fifth most significant digit. However, succeeding digit selector stages similar to the stages 35 shown may be substituted for the oscillator 44** since, as noted below, the performance of each selector stage is substantially independent of the action of all others thereby permitting an unlimited number of significant figures which may be set in frequency synthesizers constructed according to this invention.

Figure 2:
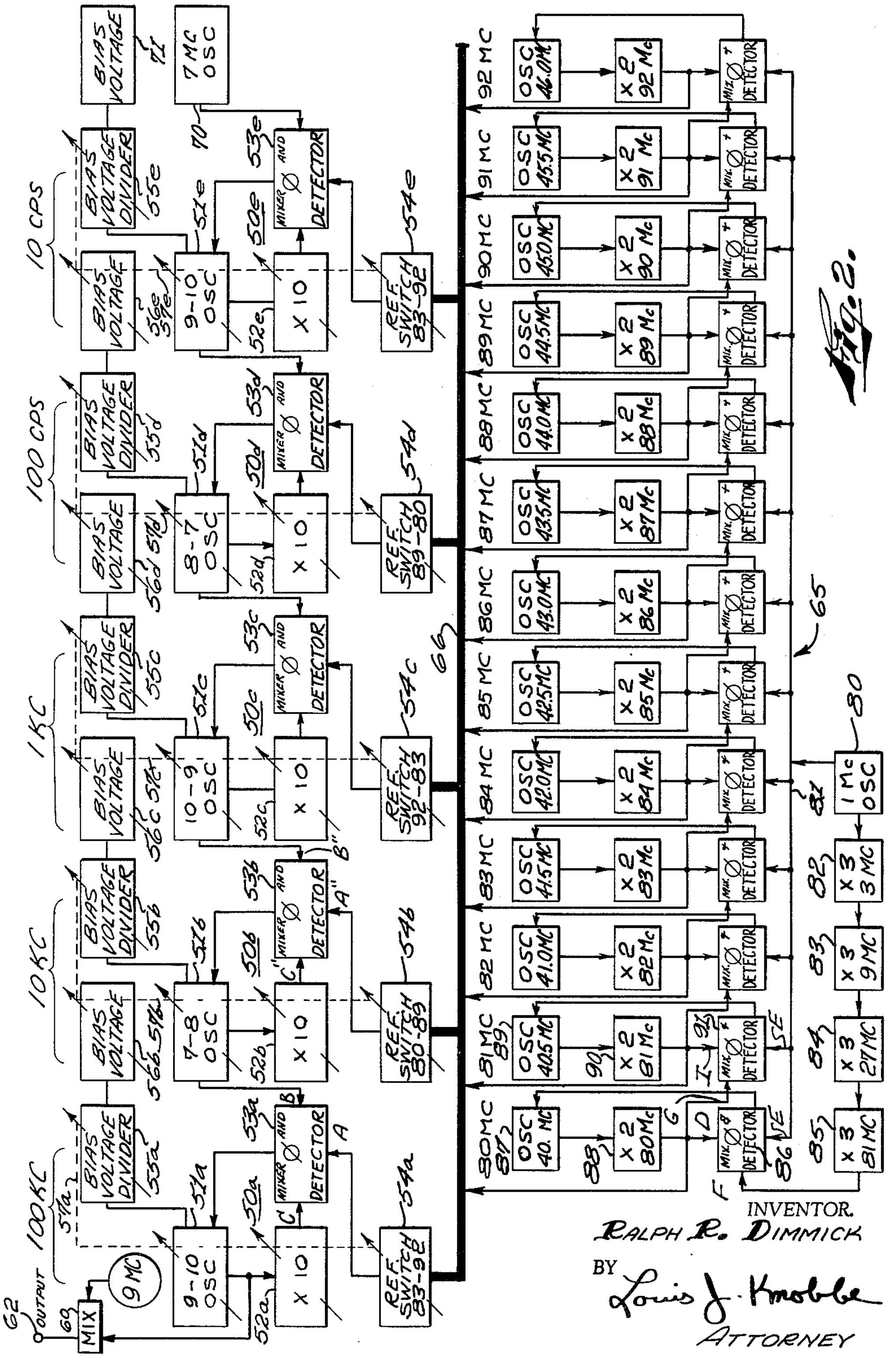
FIG. 2 is a block diagram of a preferred embodiment of the invention.

In FIG. 2 is shown a preferred embodiment of the invention which utilizes a frequency shift between the various digit selector stages for eliminating certain possible spurious frequency combinations. Only a minimum of shielding and filtering is then required to provide the desired precise preselected frequency signals at the output of the frequency synthesizer. Referring now to this figure, each of the digit selector stages **50*a*, 50*b*, 50*c*, 50*d* and 50*e* is similar in structure and function to those described heretofore in the system of FIG. 1. Thus, stage 50*a* includes a voltage controlled oscillator 51*a*, a frequency multiplier 52*a* which multiplies by a factor of 10, a combined mixer and phase detector 53*a*, and multi-contact switch 54*a*. Similarly, stage 50*b* includes voltage controlled local oscillator 51*b*, frequency multiplier 52*b*, a combined mixer and phase detector 53*b* and a multi-contact switch 54*b*. Each of the digit selector stages also includes a bias voltage divider 55 and a variable source of bias voltage 56. Accordingly, stage 50*a* includes bias voltage divider 55*a* connected to the output of the variable bias voltage source 56*b* and stage 50*b* includes a bias voltage divider 55*b* and the variable bias voltage source 56*c*. As shown, the bias voltage divider is ganged with the local voltage controlled oscillator and the multi-contact switch each associated therewith by a link 57 whereas the variable bias voltage source is connected to the link 57 of the succeeding digit selector stage. Accordingly, link 57*a* couples the oscillator 51*a*, the frequency multiplier 52*a*, multi-contact switch 54*a*, and the bias voltage divider 55*a* of stage 50*a* whereas link 57*b* couples the oscillator 51*b*, the frequency multiplier 52*b*, the multi-contact switch 54*b*, the bias voltage divider 55*b* of stage 50*b* and the variable bias voltage source 56*b* of stage 50*a***.

The combined mixers-phase detectors **53*a*, 53*c* and 53*e* operate in the same manner as the mixer-phase detectors previously described in relation to the synthesizer shown in FIG. 1. Thus, the frequency at the output of the frequency multipliers 52*a*, 52*c* and 52*e* is maintained equal to the sum of the reference frequency and the frequency supplied by the oscillator in the succeeding adjacent digit selector stage, i.e., the phase detector generates an error voltage to shift the frequency of the oscillators 51*a*, 51*c* or 51*e* if necessary to maintain the relationship defined by Equation 1. The phase detectors 53*b* and 53*d* are however connected so as to generate the respective error voltages required to maintain the output of the frequency multipliers 52*b* and 52*d* equal to the difference between the reference frequency and the frequency supplied by the oscillator in the succeeding adjacent digit selector stage. Or, in mathematical form, the phase detectors 53*b* and 53*d*** maintain the relationship $$A''-B''=C'' \quad (2)$$

where A″ is the reference frequency, B″ is the output of the oscillator in the succeeding adjacent stage, and C″ is the output of the frequency multiplier.

Each of the local oscillator stages **51*a*, 51*b* . . . 51*e*** generates a series of ten stepped frequency signals within a predetermined frequency band when no error voltage is supplied by the associated phase detector. In the frequency synthesizer shown in FIG. 2, the local oscillators operate in completely separate frequency bands between adjacent digit selector stages. For example, oscillator 51*a* of stage 50*a* operates between 9–10 megacycles whereas the oscillator 51*b* in adjacent stage 50*b* operates between 7–8 megacycles. It may also be noted that the oscillators 51*c* and 51*d* are slightly modified so as to generate the highest frequency in their respective ranges when "0" frequency is desired for the particular decimal digit which they control.

A reference frequency generator 65 is connected to each of the multi-contact switches 54*a*, 54*b* . . . 54*e*. This reference frequency generator is adapted for generating thirteen precise frequencies in 1 megacycle steps between 80 and 92 megacycles. The additional reference frequencies are required in the embodiment of FIG. 2 as compared with the embodiment of FIG. 1 so as to provide the frequency shift between adjacent digit selector stages. Certain ones of these reference frequencies are connected to each of the multi-contact switches. For example, the reference frequencies between 83 and 92 megacycles are connected to multicontact switch 54*a* and the reference frequencies between 80 and 89 megacycles are connected to multi-contact switch 54*b*. It will thus be understood that the conductor 66 represents a plurality of conductive paths each transmitting a single reference frequency to the correct multi-contact switch. As labeled in the figure, the multi-contact switches 54*c* and 54*d* are slightly modified in that the highest reference frequency is selected when the digit "0" is desired in the third or fourth significant digits. A detailed description of the structure and function of the reference frequency generator 65 will be presented hereinafter.

The output of the frequency synthesizer is derived from the output of oscillator 51*a* of the first digit selector stage 50*a*. As shown, the output of this oscillator is connected to an input of mixer 60. A fixed 9 megacycle frequency source 61 is also connected as an input to this mixer stage. The difference output of the mixer is connected to output terminal 62 as the output of the frequency synthesizer.

The operation of the frequency synthesizer shown in FIG. 2 is as follows: Each of the digit selector stages operate to phase-lock the voltage controlled oscillator associated therewith to a particular frequency determined by the reference frequency supplied the associated phase detector and the frequency supplied by the local oscillator of the succeeding adjacent digit selector stage. Thus, phase detector 53*a* supplies a voltage to the oscillator 51*a* for maintaining the sum of the frequencies from the reference frequency source and the suceeding stage local oscillator equal to the frequency supplied by the combination of the oscillator 51*a* and multiplier 52*a* as defined by Equation 1 above. By way of example, for the selection of the digit "9" for the most significant decimal digit, the reference frequency A is 92 megacycles and the frequency C supplied by the frequency multiplier 52*a* is 99 megacycles. In order that Equation 1 be satisfied, the frequency B supplied by the local oscillator 51*b* must then equal 7.000 megacycles. The output of the synthesizer at output terminal 43 is then 9.9—9 megacycles or 900,000 c.p.s. If, however, the frequency B supplied by the oscillator 51*b* is not 7.000 megacycles but is instead 7.2 megacycles, a voltage is then generated by the phase detector 53*a* which causes the local oscillator 51*a* to change in frequency to rebalance Equation 1. Signal C must then change to 99.2 megacycles. The resultant output of the synthesizer at output terminal 62 is then 920,000 c.p.s. Thus, the first digit "9" of the output has been determined by the first stage 50*a* whereas the second digit "2" has been determined by the second stage 50*b*.

The operation of the second stage 50*b* is similar to that of the first stage. However, the reference frequencies supplied by the multi-contact switch 54*b* lie in a somewhat different range than the range supplied by switch 54*a*, namely 80 to 89 megacycles instead of 83 to 92 megacycles. As noted above, the local oscillator 51*b* operates in a completely different range, namely 7 to 8 megacycles instead of the 9 to 10 megacycle range of oscillator 51*a*. When there is no control voltage supplied by the phase detector 53*b* and the multi-contact switch is connected to the 82 megacycle reference frequency, the frequency supplied by the succeeding stage local oscillator 51*c* is determined by Equation 2 wherein A″ equals 82 megacycles, C″ equals 72 megacycles, and B″ equals 10.000 megacycles. If, however, B″ is some other value such as 9.6 megacycles, an output feedback control voltage is supplied by phase detector 53*b* which forces the local oscillator 51*b* to generate a frequency of 7.24 megacycles. In turn this frequency is supplied to the first stage 50*a* as frequency B which causes an error voltage output from phase detector 53*a*. As a result, the local oscillator 51*a* of the first stage is forced to generate an output of 9.924 megacycles thereby producing an output at terminal 62 of 924,000 c.p.s., the digit "9" being determined by the first stage 50*a*, the digit "2" being determined by the second stage 50*b* and the digit "4" being determined by the third stage 50*c*. In like manner, the fourth and fifth digits of the output frequency are determined by setting the fourth and fifth stages 50*d* and 50*e*, the operation of stage 50*c* and 50*e* being similar to that of stage 50*a* and the operation of stage 50*d* being similar to that of stage 50*b*.

The input to the phase detector 53*e* included in the last stage 50*e* is shown as a fixed 7 megacycle oscillator 70 so as to maintain a zero value for the frequencies corresponding to the decimal places beyond the fifth most significant decimal digit. It will be apparent however that the selection of five variable decimal digits is completely arbitrary; succeeding stages similar to those shown may be substituted for the oscillator 70 so as to achieve even greater accuracy in the output signal.

The bias voltage dividers 55*a*, 55*b* . . . 55*e* and variable bias voltage sources 56*a*, 56*b* . . . 56*e* provide a means for facilitating the phase-locking of respective stages 50*a* through 50*e*. As heretofore noted, when a succeeding adjacent digit selector stage is varied, a resultant error voltage must be generated by the phase detector connected thereto so as to lock its associated stage at the frequency determined by the adjustment of the succeeding stage. The variable bias voltage source and bias voltage divider supplement this error voltage with an input bias potential determined by the setting of the stage in which the error voltage is generated and in the setting of the succeeding adjacent stage. Thus, the bias voltage source 56*b* is coupled to link 57*b* and is varied in accordance with the setting of the second digit selector stage 50*b*. The output of this bias voltage source is connected to a voltage divider 55*a* which in turn is connected to the link 57*a* so as to be varied in accordance with the setting of stage 50*a*. The bias voltage source and bias voltage divider are calibrated for supplying a predetermined voltage to the oscillator 51*a* in accordance with the setting of stages 50*a* and 50*b* so as to supplement the error voltage generated by the phase detector 53*a*. The bias voltage source 71 is a fixed potential because of the unvarying frequency generated by the oscillator 70. It will be understood that if additional digit selector stages are employed, a variable bias voltage source would be substituted for the source 71.

The structure and function of the reference frequency source 65 shown in FIG. 2 will now be described. As shown, a fixed 1 megacycle oscillator 80 is connected to a conductor 81 and to a frequency multiplier 82 which multiplies by a factor of 3. Since the accuracy of the frequency synthesizer is dependent upon the accuracy of oscillator 80, it is important that this oscillator be extremely stable. For this reason a precise frequency supply such as a crystal oscillator is preferred for this element. The output of frequency multiplier 82 is connected to additional frequency mutipliers 83, 84 and 85 each multiplying by a factor of 3 so as to provide an 81 megacycle input to the combination mixer and phase detector 86. Phase detector 86 is connected in a feedback phase-locked circuit including a voltage controlled local oscillator 87 and a frequency multiplier 88 which multiplies by a factor of 2. The output of the phase detector 86 supplies an error voltage to control the frequency output of the oscillator 87. A plurality of like stages each including a local oscillator, a frequency multiplier and a combination mixer and phase detector are employed as shown, the outputs of respective frequency multipliers being supplied to associated multicontact switches 54*a* through 54*e* via multi-path conductor 66.

In the reference frequency generator, each of the phase-locked stages compare the output frequency of the local oscillator with the 1 megacycle reference source 80 so as to achieve the required reference frequencies between 80 to 92 megacycles. More specifically, the phase detector 86 is supplied the three signals D, E and F and supplies an error signal to the oscillator 87 so as to satisfy the equation $$D+E=F \quad (3)$$

where D is the output of the frequency multiplier 88, E is the output of the 1 megacycle reference oscillator 80 and F is the output of the multiplier 85. Since frequencies E and F are directly dependent upon the reference oscillator 80, the phase detector insures that the oscillator 87 is locked thereto so as to operate precisely at 40 megacycles which when multiplied by a factor of 2 provides the requisite 80 megacycle reference source.

The succeeding adjacent stage of the reference generator 65 includes local oscillator 89, frequency multiplier 90 and phase detector 91 and operates as follows: The phase detector 91 is supplied with the frequencies G, E and I and provides a control voltage for oscillator 89 so as to satisfy the equation $$G+E=I \quad (4)$$

where G is the otput of the multiplier 88 in the preceding adjacent stage, E is the output of the 1 megacycle reference oscillator 80 and I is the output of the frequency multiplier 90. Since the first phase-locked stage maintains the frequency G at a constant 80 megacycles and the frequency E is the constant 1 megacycle output of the reference source 80, the oscillator 89 is maintained at a precisely 40.5 megacycles so as to maintain the output of the multiplier 90 or frequency I at precisely 81 megacycles, this frequency being connected to the multi-path conductor 66 as one of the desired reference frequencies. In a similar manner, each of the remaining phase-locked stages utilizes the output of the reference frequency 80 and the output of the preceding adjacent stage for phase-locking a local oscillator at a precise multiple of the desired output frequency.

Figure 3:
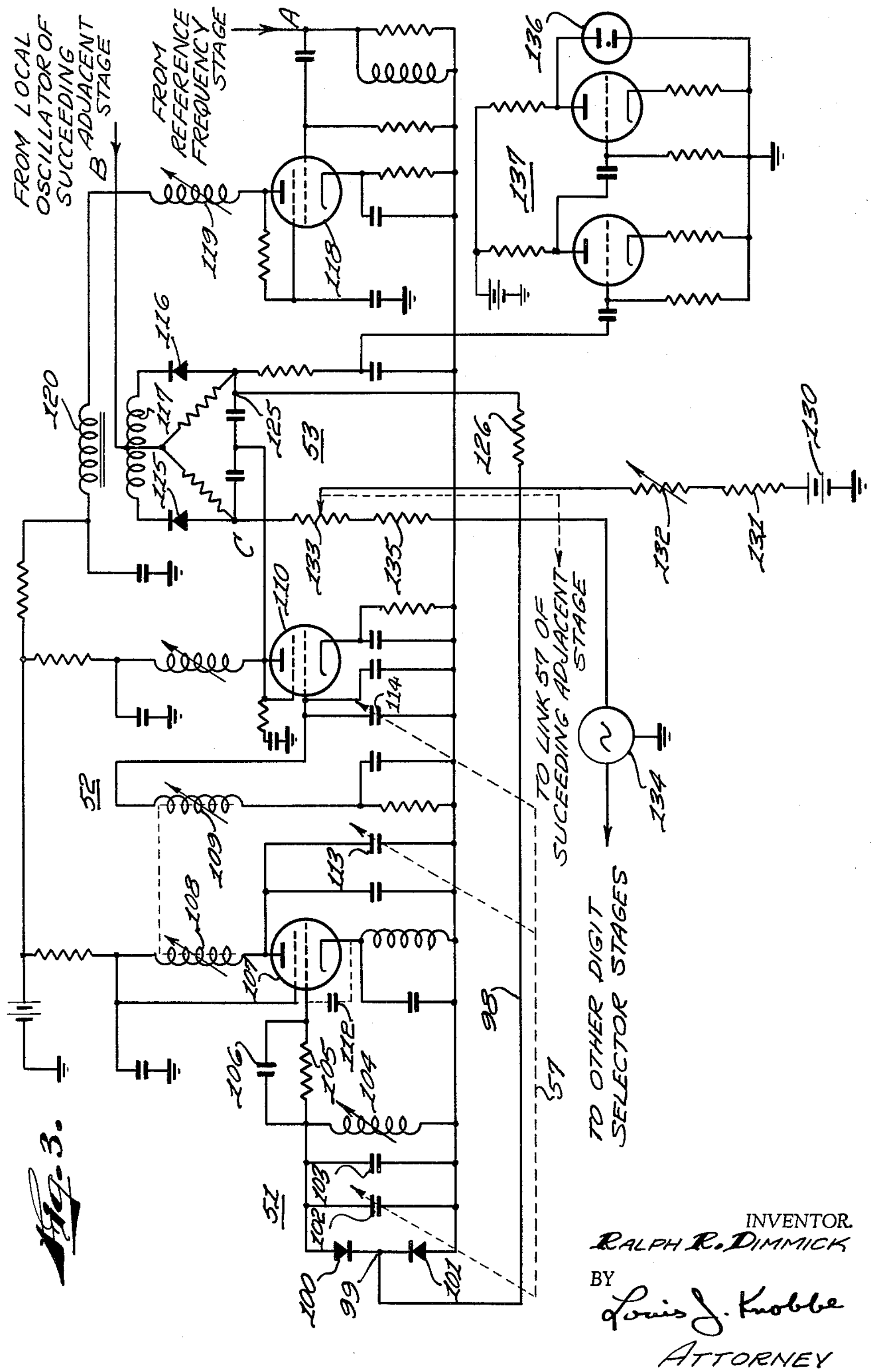
FIG. 3 is a schematic of a single digit selector stage constructed in accordance with this invention and which illustrates the phase-locking means.

In FIG. 3 is shown, by way of specific example, circuitry for a representative phase-locked digit selector stage. In this figure, the oscillator, frequency multiplier and phase detector bear the same numerals as those shown in block diagram form in FIG. 2. It will however be apparent that the circuitry shown in FIG. 3 may be employed in constructing the system of FIG. 1. As shown in FIG. 3, the voltage controlled oscillator 51 may incorporate a pair of capacitors 100, 101 of the type which vary in capacitance according to the frequency control voltage applied across their terminals. This property, for example, is exhibited by silicon capacitors. In the circuit shown, this control voltage comprises the error voltage supplied by the phase detector 53 between ground and the conductor 98 which is connected to the common junction 99 of the capacitors. A frequency selecting variable capacitor 102, a fixed capacitor 103 and a tunable inductance 104 are connected in parallel to the other terminals of the voltage variable capacitors. This circuitry is connected via coupling resistor 105 and capacitor 106 to the control grid of tetrode 107. A feedback path is provided by the stray capacitance 112 between the control grid and cathode of this tetrode.

Tetrode 107 functions as a Class C harmonic generator and includes an inductance 108 which is tuned to the fifth harmonic of the plate signal by variable capacitor 113. Another inductance 109 is magnetically coupled to the control grid of tetrode 110. This tetrode also functions as a Class C harmonic generator and includes in its plate circuit an inductance 111 tuned to the second harmonic of the signal connected to the control grid thereof. A variable capacitor 114 is also connected to the control grid of tetrode 110 as shown. Accordingly, the output of the voltage controlled oscillator 51 is multiplied by respective factors of 5 and 2 for a total multiplication by a factor of 10, the circuitry thus providing the frequency multiplier 52.

The variable capacitors 102, 113 and 114 are connected to the link 57 shown in FIG. 2. These capacitors are shown by way of convenience as a single variable capacitor; however, these capacitors will normally include a plurality of discrete fixed capacitors individually connected across the capacitors 100, 101 to provide the desired one of a plurality of stepped frequency output signals.

The output signal C from tetrode 110 is connected as an input to the combination mixer-phase detector 53 comprising diodes 115 and 116 respectively connected to ends of transformer winding 117. The A and B frequency signals are also respectively connected to the phase detector 53, the reference frequency A being connected to transformer winding 120 via tetrode 118 and a tunable inductance 119, and the signal B from the local oscillator included in the succeeding adjacent stage being connected to a mid-point of transformer winding 117.

The detector 53 shown in FIG. 3 provides a balanced phase detector. This detector is sensitive to a change of phase of any of the signals A, B or C and generates an error voltage proportional to the phase difference between these signals. This error voltage appears between node 125 and ground and is connected via resistor 126 and conductor 98 to the input 99 of oscillator 51.

The digit selector stage shown in FIG. 3 includes additional circuitry for insuring that the stage is properly phase-locked, this circuitry including the series connected bias source 130 represented by a battery, resistor 131, variable resistor 132 and potentiometer 133 connected between the phase detector 53 and ground.

Potentiometer 133 is connected to link 57 of the succeeding adjacent digit selector stage and functions in the manner of the variable bias source 56 shown in FIG. 2 and described hereinabove. While element 133 is illustrated as a continuously variable potentiometer for ease of illustration, this element will usually comprise a plurality of series connected fixed resistors, one for each digit value. These resistors are selectively connected between the battery 130 and the phase detector 53 and are appropriately valued to provide a predetermined bias voltage to the oscillator 51 for each setting of the succeeding adjacent digit selector stages. The variable resistor 132 provides a manual control for the operator to utilize if and when the oscillator 51 fails to lock automatically.

Still additional locking circuitry shown in FIG. 3 includes the low frequency oscillator 134 which periodically supplies a low impedance direct current return to ground for the biasing network, the oscillator being connected to the potentiometer 133 via fixed resistor 135. A visual means for detecting when the digit selector stage is out of lock comprises neon tube 136 energized by neon control amplifier 137. In the out of lock condition, the low frequency signal, e.g. 10 c.p.s., supplied by generator 134 passes through the phase detector to the voltage controlled variable capacitors 100, 101 so as to sweep the oscillator 51. In the out of lock condition, a strong 10 c.p.s. signal is present at the grid of the neon control amplifier 137 so as to fire the neon at a 10 c.p.s. rate, thus indicating an out of lock condition. The operator is then visually warned to vary the potentiometer 132 so as to change the bias supplied to the oscillator. When the stage is locked, the 10 c.p.s. signal will be nulled out or cancelled by a nearly equal and opposite signal from the phase detector; thus, the neon tube 136 will then not be fired and the oscillator will be swept for only fractions of a cycle by the residual 10 c.p.s. signal.

A particular advantage of frequency synthesizers constructed as described hereinabove is that the system avoids multiplying such spurious effects as noise modulations occurring in the lower order decimal digits. Thus, if a spurious modulation is picked up in any one of the digit selector stages, it will only appear in the output signal, in the order corresponding to the digit stage in which it originated. Of course, if the band width of the phase-locked stage of the next higher order digit is lower than the signal plus the spurious band width, the spurious modulation will not appear at all in the output signal. This allows a substantially unlimited number of digit selector stages to be cascaded thereby permitting the output signal to set any desired accuracy. Thus, even though spurious signals and phase jitter may mask the lower order digits on a short term basis, the average output frequency is absolutely related to the reference frequency by the number preset in the digit selector stages.

Although an exemplary embodiment of the invention has been disclosed herein for purposes of illustration, it will be understood that various changes, modifications and substitutions may be incorporated in such embodiment without departing from the spirit of the invention as defined by the claims which follow:

I claim:

1. A frequency synthesizer having a plurality of cascaded phase-locked digit selector stages arranged consecutively in the order of decreasing significance of digits in the output frequency signal, each of said stages including digit selecting means for setting a digit of the number indicative of the frequency to be synthesized, said number being expressed in a number system having a radix, means for producing a predetermined number of reference frequencies irrespective of the number of said stages, the improvement comprising in each stage a local oscillator having a plurality of selectable stepped output frequency signals, the digit selecting means of each stage being coupled to said means for producing a plurality of reference frequencies and to the local oscillator of the respective stage for selecting a reference frequency and a stepped output frequency signal of said local oscillator of the respective stage, a frequency multiplier connected with the output of said local oscillator for multiplying the output frequency signal produced by said local oscillator by a predetermined number, a mixer and phase detector, said mixer and phase detector having as a first input a selected one of a plurality of said reference frequencies, the selection thereof being determined by the digit to be set by said digit selecting means, said mixer and phase detector having as a second input the output frequency signal produced by the local oscillator of the next preceding stage or, for the least significant stage, another reference frequency, and said mixer and phase detector having as a third input the frequency signal produced by said frequency multiplier, said mixer and phase detector being coupled to the local oscillator in its same stage for applying a control signal thereto to vary the frequency thereof in a sense that tends to reduce said control signal to zero when a predetermined one of said first, second and third inputs equals the sum of the other two of said inputs, and the frequency to be synthesized being derived from the output of the local oscillator in the most significant digit selector stage.

2. A frequency synthesizer as in claim 1 wherein the sum of the first and second input frequencies to said mixer and phase detector of at least one stage equals the third input frequency when the output signal of said detector is zero.

3. A frequency synthesizer as in claim 1 wherein the sum of the second and third input frequencies to said mixer and phase detector of at least one stage is equal to said first input frequency when the output signal of said mixer and phase detector is zero.

4. A frequency synthesizer as in claim 1 wherein the sum of the first and second input frequencies of the mixer and phase detector in each of certain stages equals the third input frequency thereof when the output signal of its respective mixer and phase detector is zero, and the sum of the second and third input frequencies of the mixer and phase detector in each of alternate stages equals the first input frequency thereof when the output signal of its respective mixer and phase detector is zero.

5. A frequency synthesizer as in claim 1 wherein the local oscillators of adjacent stages operate in non-overlapping frequency ranges.

6. A frequency synthesizer as in claim 1 wherein at least certain stages are provided with means for indicating an out-of-lock condition in that stage, said last means comprising a low frequency oscillator and indicator lamp connected to the mixer and phase detectors of said certain stages, said low frequency oscillator causing the local oscillator of each respective stage to sweep and the indicator lamp to be periodically lit when the respective stage is not in a locked condition.

7. A frequency synthesizer as in claim 1 wherein said frequency multiplier of each stage multiplies the frequency produced by its respective local oscillator by a number equal to the radix of the number system.

8. A frequency synthesizer having a plurality of cascaded phase-locked digit selector stages arranged consecutively in the order of decreasing significance of digits in the output frequency signal, each of said stages including digit selecting means for setting a digit of the number indicative of the frequency to be synthesized, said number being expressed in a number system having a radix, means for producing a predetermined number of reference frequencies irrespective of the number of said stages, the improvement comprising in each stage a local oscillator having a plurality of selectable stepped output frequency signals, the digit selecting means of each stage being coupled to said means for producing a plurality of reference frequencies and to the local oscillator of the respective stage for selecting a reference frequency and a stepped output frequency signal of said local oscillator of the respective stage, a frequency multiplier connected with the output of said local oscillator for multiplying the output frequency signal produced by said local oscillator by a predetermined number, a mixer and phase detector, said mixer and phase detector having as a first input a selected one of a plurality of said reference frequencies, the selection thereof being determined by the digit to be set by said digit selecting means, said mixer and phase detector having as a second input the output frequency signal produced by the local oscillator of the next preceding stage or, for the least significant stage, another reference frequency, and said mixer and phase detector having as a third input the frequency signal produced by said frequency multiplier, said mixer and phase detector being coupled to the local oscillator in its same stage for applying a control signal thereto to vary the frequency thereof in a sense that tends to reduce said control signal to zero when a predetermined one of said first, second and third inputs equals the sum of the other two of said inputs, each stage further including a bias voltage means connected to the local oscillator thereof for changing the frequency of the latter, said bias voltage means being operated by the digit selecting means of the next less significant stage, and the frequency to be synthesized being derived from the output of the local oscillator in the most significant digit selector stage.

9. A frequency synthesizer having a plurality of digit selector stages, a source of reference frequency signals, digit selecting means in each stage for setting a digit of the number indicative of the frequency to be synthesized, the improvement comprising first means in each stage for generating any one of a plurality of stepped frequency output signals when no control signal is supplied thereto and frequency signals between said stepped frequency output signals when appropriate control signals are applied thereto, said digit selecting means in each stage connected to said source of reference frequency signals for selecting any one of said reference frequency signals, the number of said reference frequency signals not being dependent upon the number of said stages, and said digit selecting means of each stage being mechanically connected to the respective first means of each stage for selecting the stepped frequency output signals of said first means, second means in each stage connected to receive and multiply the output of said first means in each stage, third means in each stage, said third means in each stage except for the least significant stage combining a reference frequency signal selected by the digit selecting means in the respective stage, and the output signal of the second means in the respective stage, and the output signal of the first means in the digit selector stage corresponding to the next lower significant digit, said third means in the least significant stage combining a reference frequency signal selected by the digit selecting means in the least significant stage, the output signal from the second means thereof, and another reference frequency, said third means in each stage producing an output control signal indicative of a change of phase in any one of the signals applied thereto and controlling the first means of the respective stage to supply output frequency signals between said stepped frequency output signals to said second means, and the output of the first means in the digit selector stage corresponding to the highest significant digit providing the output signal of the frequency synthesizer.

10. A frequency synthesizer including a plurality of cascaded phase-locked digit selector stages, means for producing a predetermined number of reference frequencies irrespective of the number of said stages, a first phase-locked digit selector stage having a first oscillator for producing any one of a plurality of stepped frequency output signals within a first predetermined frequency range, a first multiplier for multiplying the output of said first oscillator, and a first mixer and phase detector connected to the output of said first multiplier and responsive thereto for supplying a control signal to said first oscillator for maintaining its frequency of oscillation proportional to the sum of a reference frequency from said means for producing a predetermined number of reference frequencies and the output of a second oscillator in a second phase-locked digit selector stage corresponding to the next lower significant digit, said second phase-locked digit selector stage having said second oscillator for providing any one of a plurality of stepped frequency output signals within a second predetermined frequency range different than said first predetermined frequency range, a second multiplier for multiplying the output of said second oscillator, and a second mixer and phase detector responsive to the output of said second multiplier for supplying a control signal to said second oscillator for maintaining its frequency of oscillation proportional to the difference between a reference frequency from said means for producing a predetermined number of reference frequencies and the output of a third oscillator, and the output of said first oscillator providing the output of said frequency synthesizer.

References Cited by the Examiner

UNITED STATES PATENTS

| | | | |
|---|---|---|---|
| 2,287,925 | 6/1942 | White | 331—4 X |
| 2,775,701 | 12/1956 | Israel | 331—2 |
| 2,786,140 | 3/1957 | Lewis | 331—2 |
| 2,794,918 | 6/1957 | Bourgonjon et al. | 331—4 |
| 2,924,783 | 2/1960 | Shapiro et al. | 331—18 X |
| 2,957,144 | 10/1960 | Huhn | 331—48 X |

ROY LAKE, *Primary Examiner.*

JOHN KOMINSKI, *Examiner.*